United States Patent [19]

Donovan

[11] Patent Number: 4,688,000
[45] Date of Patent: Aug. 18, 1987

[54] NON BIASED PUSH-PULL AMPLIFIERS

[76] Inventor: John S. Donovan, 18503 Santa Rosa, Detroit, Mich. 48221

[21] Appl. No.: 709,109

[22] Filed: Mar. 7, 1985

Related U.S. Application Data

[63] Continuation of Ser. No. 614,631, Jun. 29, 1984, abandoned, and Ser. No. 615,217, Jun. 29, 1984, abandoned.

[51] Int. Cl.[4] .............................................. H03F 3/26
[52] U.S. Cl. .................................... 330/269; 330/262; 330/264; 330/276
[58] Field of Search ............... 330/263, 264, 269, 276, 330/262; 307/262

[56] References Cited

U.S. PATENT DOCUMENTS 3,348,128  10/1967  Storm .................................. 307/262
4,024,471   5/1977  Bakken ............................... 330/263

Primary Examiner—Gene Wan

[57] ABSTRACT

A push-pull, small signal amplifier arrangement, which employs Metal Oxide Semiconductor/Field Effect Transistors. Depletion type are employed in the first stage, while enhanced type are employed in the second stage. The two stages are directly connected together and means for controlling the gain of both stages simultaneously are included. Also disclosed are a number of configurations for various applications.

14 Claims, 7 Drawing Figures

NON BIASED PUSH-PULL AMPLIFIERS

CROSS REFERENCE TO RELATED APPLICATIONS

This application is a continuation-in-part of Ser. Nos. 614,631 and 615,217, filed May 29, 1984; both now abandoned.

BACKGROUND AND SUMMARY OF THE INVENTION

When utilizing Metal Oxide Semiconductor/Field Effect Transistors (MOS-FETs); it is general knowledge that as amplifiers they are limited to small signal situations. It is also known, that when they are structured as depletion type devices, that their ability to amplify incoming signals is not restricted to the reversed biased range of their gate to source voltage handling limitation, but will tolerate temporary excursions into the forward biased range without degrading the impedance between the gate and the source. This characteristic makes possible a zero biased arrangement for the purpose of signal amplification. It is also possible to structure MOS-FETs in a push-pull arrangement so that the above mentioned potential can be maximized.

The fact that the transconductance of such transistors increases in proportion to the on-resistance makes it desirable to structure the channel's cross-sectional dimensions as small as possible. The resect use of lasers in the manufacturing of said devises can reduce such dimensions to much less than one micron, with a high degree of consistency in maintaining such dimensions.

After considering the above mentioned abilities when used in combination, it is realistic to expect a gigantic increase in performance. Said increase would not necessarily manifest itself by virtue of a larger output signal, but more so by the ability of the incoming signal to overcome the internal noise, that is inherent in all electronic amplifiers.

It is the intent of this disclosure to bring to general knowledge an extremely sensitive amplifier arrangement, which can be employed in a wide range of applications.

It is a further intent of this disclosure to bring to general knowledge an extremely sensitive amplifier arrangment, which is not limited in performance by the inherent inaccuracy of biasing resistors.

It is a still further intent of this disclosure to bring to general knowledge an extremely sensitive amplifier arrangement, which is not subject to clipping the incoming signal at the output of the amplifier even though the gates of the transistors may be driven beyond the pinch-off voltage; thus increasing the minimum to maximum signal handling ability.

It is still another intent of this disclosure to bring to general knowledge an extremely sensitive amplifier arrangement, which the generally associated accessories are easily included.

It is, also, an intent of this disclosure to bring to general knowledge an extremely sensitive amplifier arrangement, which the inherent logarithmic characteristics of the transistors of the first amplifying stage are greatly reduced and the variations of the amplification ratio of said stage are reduced by a succeeding amplifying stage.

It is the final intent of this disclosure to bring to general knowledge an extremely sensitive amplifier arrangement, which the generally associated accessories can be included so as to extend their effective range insofar as said accessories can be applied to a radio wave amplifier.

The preceding stated intentions of the present disclosure, which will become apparent upon a reading of the following specification and claims, are accomplished by the opposed positioning of two MOS-FETs (depletion type). These devises, which are connected directly together at their source ends and indirectly together at their drain ends through a center-tapped electromagnetic induction coil or load resistor, represent the essential components of the arrangement. Said electromagnetic induction coil functions as the primary side of a transformer coupling, where as said load resistor requires a capacitor at both ends in order to do the same.

The input to the gates of the opposing transistors can come from the secondary side of a transformer, which indirectly ties the two gates together or from the ends of a microphone diaphragm coil. Said input could, also, come through two separate capacitors. A capacitor is disposed between the gates of the transistors when the secondary side of a transformer coupling is employed for the purpose of accommodating radio frequencies. The need for center-tapping the secondary side the transformers, that conduct incoming signals to the gates, been eliminated.

As it is intended to function as an amplifier, but without the need for biasing resistors the voltage handling ability between the source end of the transistors and their respective input gates is of equal potential into either the forward or reverse voltage range before the impedance between the gate and the channel is burnt out. As the channel's cross-sectional dimensions are intended to be extremely small, the reverse polarity swing of the gate to source would cause the channel's electrical conductivity to cease long before the above mentioned limitation is reached. In order to exploit the full potential of the gate to source voltage handling ability a push-pull configuration is required. The forward polarity swing of the gate to source would be to a point of higher transconductance, which would greatly reduce the clipping effect of the alternate transistor's shift to pinch-off voltage which would be to a point of less transconductance. The extremely small cross-sectional dimensions of the channel are integral with the desire for higher transconductance characteristics.

The supply voltage available to the symmetrical portion of the embodiment may be limited by inserting a variable resistor into the line leading to the point of juncture between the source ends of the two transistors. Said resistance could be either manually or transistorized controlled.

A second optional control may be included by positioning a MOS-FET (enhanced type) between and connected to the two wires leading to the primary side of the transformer preceding the first amplifying stage when said essential components are used for amplifying radio frequencies. The inclusion of such a component will allow the employment of MOS-FETs (depletion type) as amplifiers with an unusually thin layer of silicon dioxide, which acts as an insulator between the gate and the channel. This increases the ability of the incoming signals to overcome the internal noise without fear of burning out the insulating layer due to the extreme strength variations of the incoming signals. Said extreme variations are particularly associated with radar and sonar applications.

In order to maximize the effectiveness of this second optional device the surface area between the two extremes of the voltage induced channel can be enlarged by diffusing said extremes so as to be dispositioned into relatively long parallel lines in close proximity thus reducing the reducing channel's on-resistance. An inclusion of this type of transistor would involve a unique arrangement; in that the source end and the drain end of said component are not established as in all other circuitry, but are continually exchanging polarity at the same rate as the incoming signal. In order for such a relationship to effectively operate neither end of the voltage induced channel can be grounded. Said channel is induced by generating a sufficient voltage of the proper polarity between the gate and the substrate in order to partially and controllably short circuit the primary side of the transformer coupling preceding the first amplifying stage. The inclusion of two biasing resistors are for the purpose of bringing such a device to it's required threshold voltage.

A third option is the matching of depletion type transistors to enhanced type MOS-FETs or enhanced type MOS-Power Transistors. The purpose of directly coupling the two different type of transistors is that as the depletion type are shifted to a point of lesser transconductance the enhanced type would be shifted to a point of greater transconductance. This relationship tends to stabilize the amplification ratio regardless of the variations in the signal strength at the input of the circuit. The possible application of either of the two different types of enhanced transistors would be dependent on the intent for which the curcuit was meant. Enhanced MOS-FETs are strictly for small signals such as radio or radar receiver type, while MOS-Power Transistors are for high power applications such as a transmitter or line driver situation. Those configurations in which the possibility of the first amplifying stage's transistors being driven beyond pinchoff would require the succeeding stage's transistors to have a voltage applied to their gates, that would be well above the transistors threshold point.

DETAILED DESCRIPTION

Figure 1:
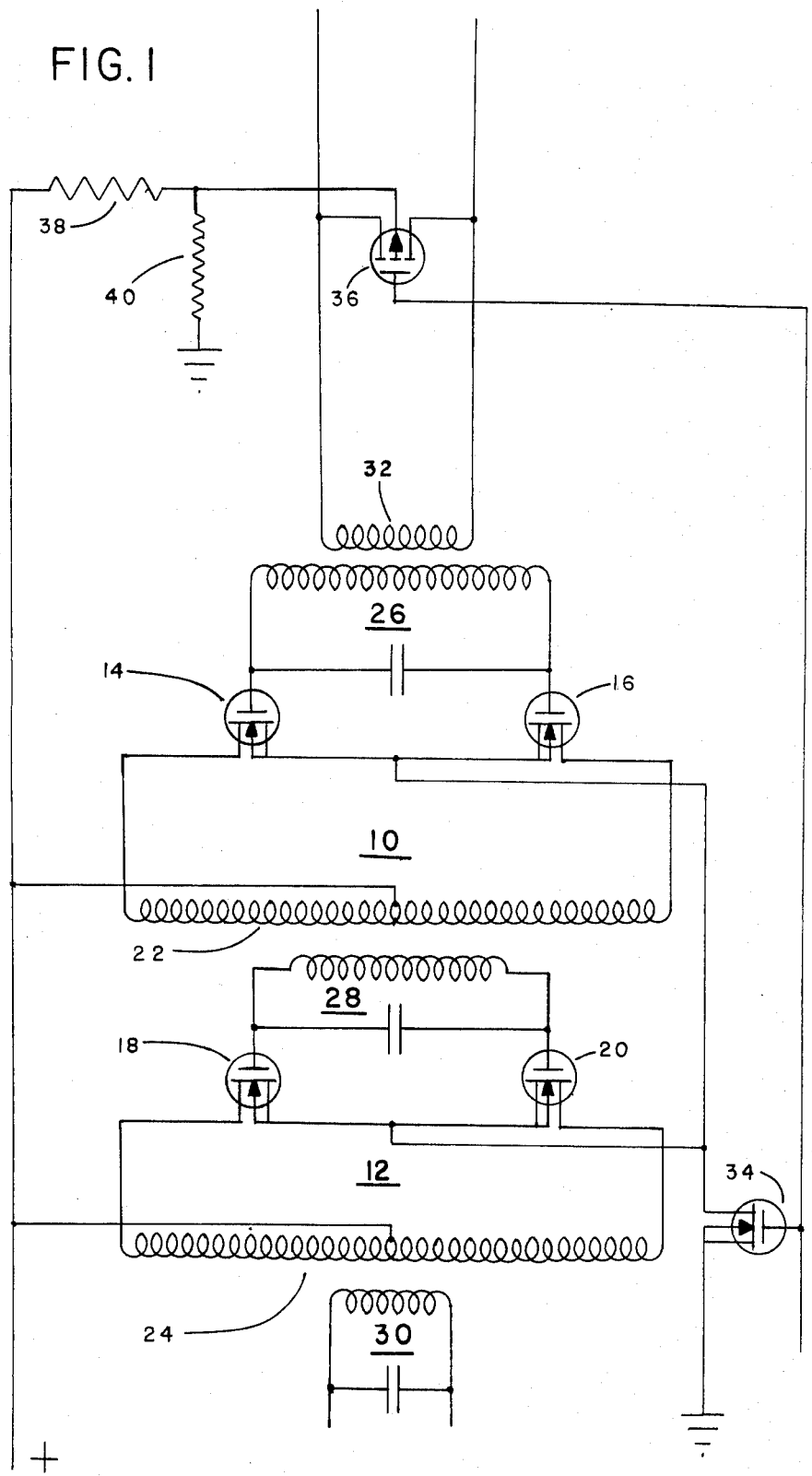
FIG. 1 is a schematic representation of the amplifier arrangement when configured for a radio wave receiver.
Figure 4A:
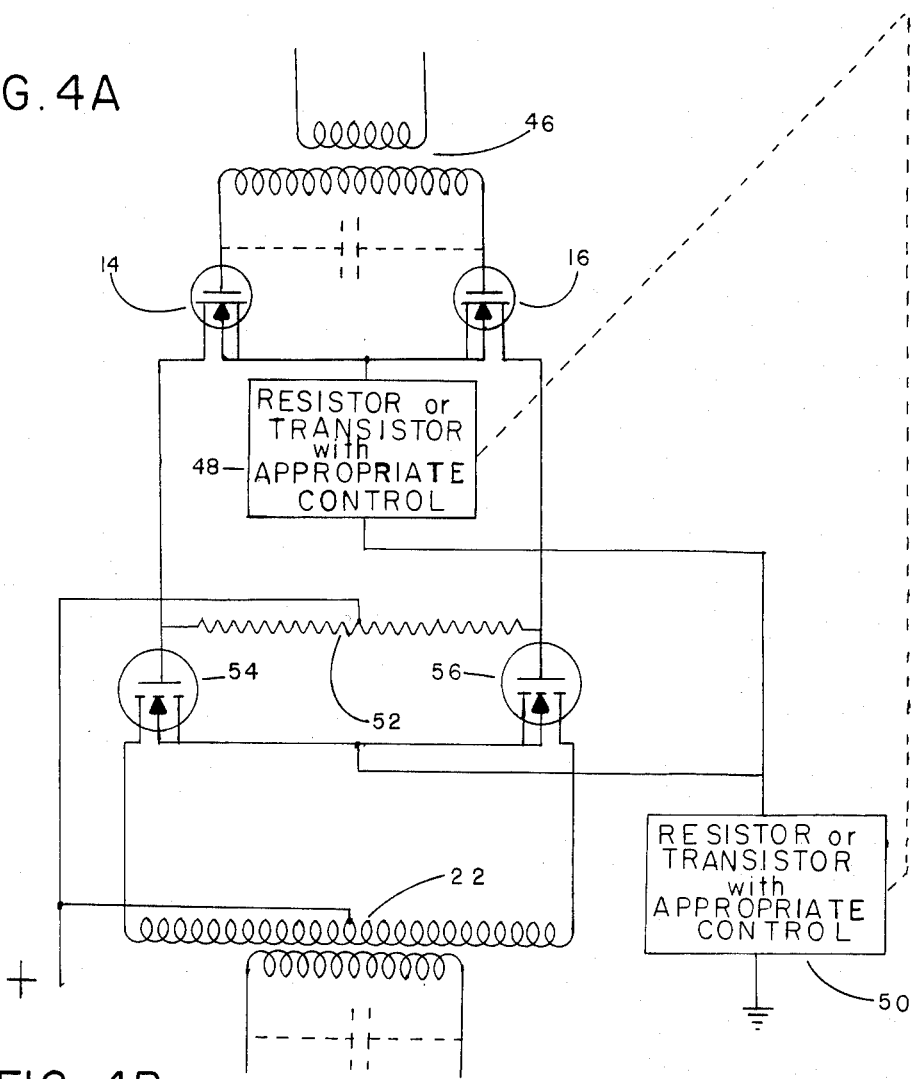
FIG. 4A is a schematic representation of the amplifier arrangement intended as an extension of the configurations represented by FIGS. 1, 2A, 2B, 3A, 3B.

Referring to FIG. 1, the essential components of all the configurations shown are indicated generally by the number 10 or 12. This encompasses transistors 14 and 16 of the first amplifying stage, transistors 18 and 20 of the second amplifying stage and electromagnetic induction coils 22 and 24 of the above mentioned amplifying stages accordingly. With capacitor coupling variations said induction coils are replaced by a load resistor 118 (FIG. 2B) or 52 (FIG. 4A).

As this configuration is for the purpose of dealing with radio waves the essential comonents for such are indicated by the numbers 26, 28 and 30 which represent radio wave tuned circuits that receive their energy from the induction coils 32, 22 and 24. The first electromagnetic induction coil 32 and center-tapped electromagnetic induction coils 22 and 24 serve as the primaries of the amplifying stages transformer couplings. The coils of the radio wave tuned circuits function as the secondaries of said couplings.

Transistor 34 limits the magnitude of the signal at the output of the circuit by inhibiting the amount of the supply voltage to the amplifying stages. This will reduce the supply voltage to pinch-off voltage ratio. The control of such would determine the amplification ratio of both amplifying stages simultaneously. An extension of the aforementioned ability can be brought about by the inclusion of a second transistor 36 of which the characteristics are unlike any of the other transistors in this circuit thus far. This device best known as an enhanced type MOS-FET is wired in parallel with the first electromagnetic induction coil 32; in such a manner that neither lead wire to the first electromagnetic induction coil 32 is grounded. If sufficient voltage of the proper polarity is generated between the gate and the substrate of transistor 36 a partial short circuiting of the electromagnetic induction coil 32 will occur and then become overwhelming as the difference in voltage between the gate and the substrate increases. Transistors 34 and 36 receive their gate controlling voltage through a common lead line. Threshold voltage for transistor 36 is partly achieved by the inclusion of biasing resistors 38 and 40.

Figure 2A:
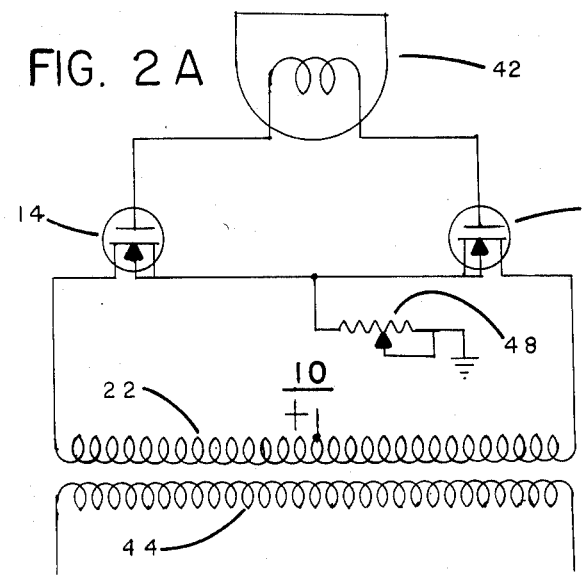
FIG. 2A is a schematic representation of the amplifier arrangement when configured for a preamplifier for an audio or ultrasonic microphone.

Referring to FIG. 2A, the same set of numbers are used to indicate the essential components of the first amplifying stage of FIG. 1 are also used. As this configuration is for the purpose of audio or ultrasonic sound, the radio wave circuitry of FIG. 1 is now replaced by a microphone 42 and is included similarily; that is, the two ends of the microphone diaphragm coil are connected directly to the gates of the transistors 14 and 16.

The secondary side of the transformer indicated by the numbers 44 couples the amplifier through the primary side of the transformer indicated by the number 22 to any succeeding amplifying stage. A manual gain control 48 can be included in much the same manner as the transistorized control of FIG. 1.

Figure 3A:
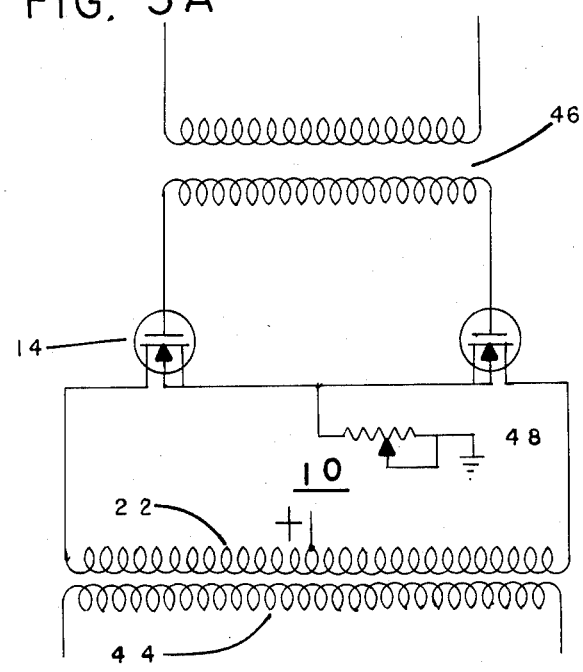
FIG. 3A is a schematic representation of the amplifier arrangement when configured for the first stage of an analogue system such as would be found after the demodulator in a radio or radar receiver.

Referring to FIG. 3A, the same set of numbers used to indicate the essential components of the first amplifying stage of FIG. 1 are again used. Though similar in configuration to FIG. 1 the intended frequency handling abilities of this arrangement would be much more like the frequencies utilized by the arrangement shown in FIG. 2A. The only significant difference between FIGS. 2A and 3A is the inputting of the incoming signal to transistors 14 and 16 through transformer 46. A manual gain control 48 can be included in the same manner as that of FIG. 2A. The output of this configuration is exactly the same as the previous configuration explained in the preceding paragraph.

Figure 2B:
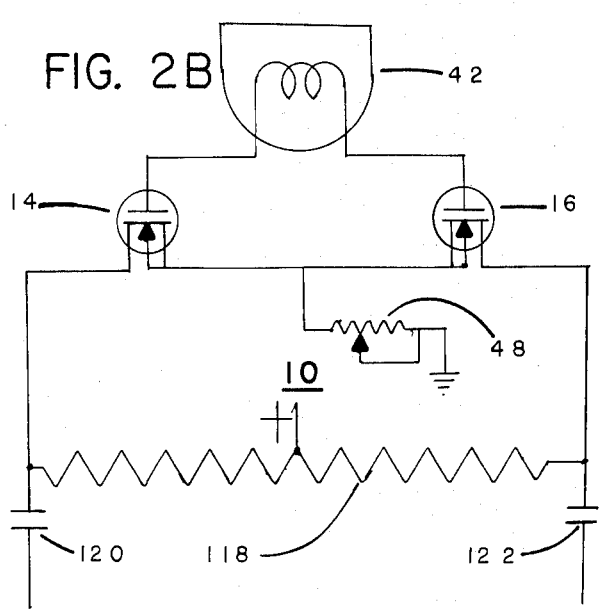
FIG. 2B is a schematic representation of a variation of the configuration shown in FIG. 2A.

Referring to FIG. 2B, this configuration is much like that shown in FIG. 2A. This encompasses transistors 14 and 16, but utilizes load resistor 118 and coupling capacitors 120 and 122 in place of a transformerized coupling to any succeeding circuit. Resistor 48 functions the same as the manual gain control of FIG. 2A.

Figure 3B:
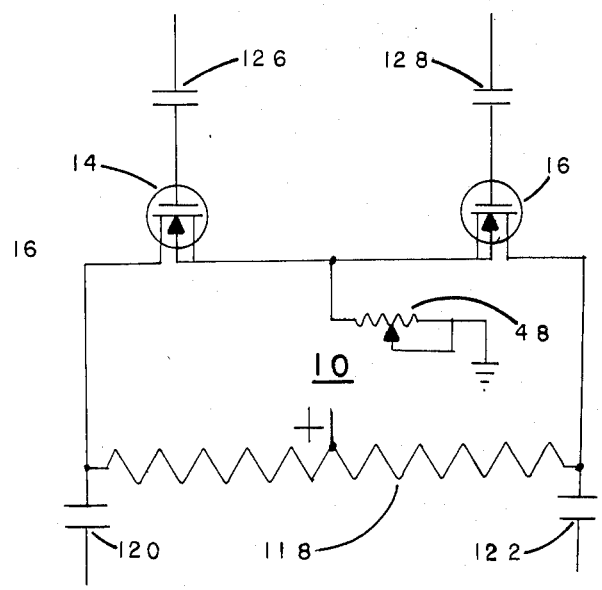
FIG. 3B is a schematic representation of a variation of the configuration shown in FIG. 3A.

Referring to FIG. 3B, this configuration is much like that shown in FIG. 2B, but utilizes separate inputs to the transistors consisting of capacitors 126 and 128. Resistor 48 functions the same as the manual gain control of FIG. 2B.

Referring to FIG. 4A, the same set of numbers used to indicate the essential components of the first amplifying stage of FIG. 1 are again used, except a load resistor 52 now replaces the electromagnetic coil 22 as the output of the transistors 14 and 16 are connected directly to the inputs of the enhanced type transistors 54 and 56. Said load resistor is center-tapped and functions as a means to the positive side of the supply voltage for the first amplifying stage. The voltage drop across the depletion type transistors of the first amplifying stage functions as a threshold generator for the succeeding amplifying stage's enhanced type transistors. A calibrating resistor 48 is included to assist in acquiring the desired threshold voltage. Volume control 50 is connected to both amplifying stages. The first stage connection can be through said calibrating resistor 48 to the common reference electrode of the first amplifying stage's transistors, while the second stage connection is directly to the common reference electrode of the second amplifying stage's transistors. A mechanical linkage between calibrating resistor 48 and volume control resistor 50 can be included in such a manner so that the resistance of both devices are increased simultaneously in order to stabilize the voltage drop between the negative end of calibrating resistor 48 and the input electrodes of the two enhanced type transitors 54 and 56. Resistors 48 and 50 can be replaced by transistors that are controlled by a common applied voltage line in much the same manner as the mechanical linkage of said resistors. The input to this configuration could be any one of the previously disclosed type, but the output of said configuration is intended to be the same as that of FIGS. 1, 2A and 3A.

Figure 4B:
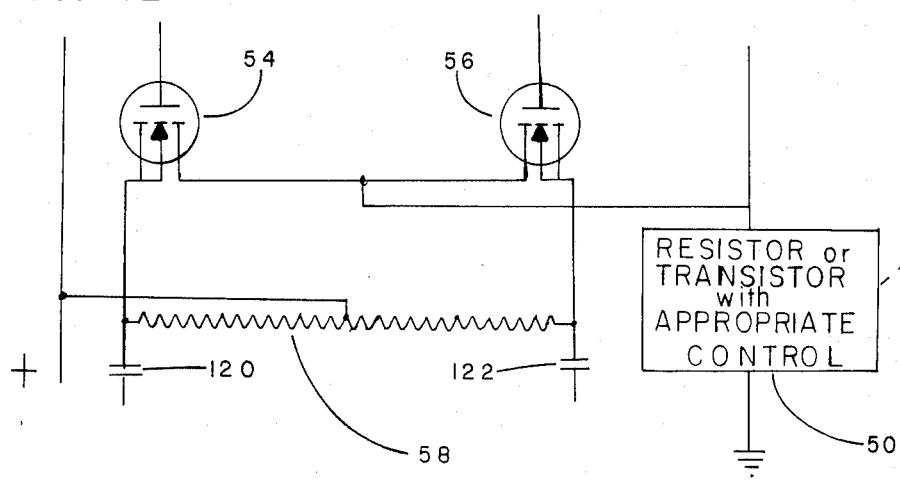
FIG. 4B is a schematic representation of the amplifier arrangement intended as a variation of the extension of the configuration represented by FIG. 4A.

Referring to FIG. 4B, the only significant difference between this configuration and the preceding one is the outputting of the amplified signal through two separate coupling capacitors 120 and 122, which are indirectly connected by a center-tapped load resistor 58 as a means to the positive side of the supply voltage for the second amplifying stage.

I claim:

1. An amplifier comprising first and second transistors, each having a separate input electrode, a separate output electrode and a directly combined reference electrode, input means connecting the input electrodes of said first and second transistors for deriving first input signals for said first transistor and second input signals of opposite phase for said second transistor from said input means to said transistors, separate output means connected between the output electrodes of said first and second transistors for combining first amplified signals provided by said first transistor and second amplified signals provided by said second transistor to provide output signals for a push-pull stage, without biasing means utilizing depletion type Metal Oxide Semiconductor Field Effect Transistors.

2. An amplifier comprising two identical stages in sequence, the first stage comprising first and second transistors, each transistor having a separate input electrode, a separate output electrode and a directly combined reference electrode, input means connecting the input electrodes of said first and second transistors for deriving first input signals for said first transistor and second input signals of opposite phase for said second transistor from said input means to said transistors, separate output means connected between the output electrodes of said first and second transistors for combining first amplified signals provided by said first transistor and second amplified signals provided by said second transistor to provide output signals for a push-pull stage, without biasing means utilizing depletion type Metal Oxide Semiconductor Field Effect Transistors, said output means comprises a coupling function to a succeeding stage, said succeeding stage comprising first and second transistors, each transistor having a separate input electrode, a separate output electrode and a directly combined reference electrode, input means connecting the input electrodes of said first and second transistors to the output means of the first amplifier stage for deriving first input signals for said first transistor and second input signals of opposite phase for said second transistor from said input means to said transistors, separate output means connected between the output electrodes of said first and second transistors for combining first amplified signals provided by said first transistor and second amplified signals provided by said second transistor to provide output signals for a push-pull stage, without biasing means utilizing depletion type Metal Oxide Semiconductor Field Effect Transistors.

3. An amplifier comprising first and second transistors, each having a separate input electrode, a separate output electrode and a directly combined reference electrode, input means connecting the input electrodes of said first and second transistors for deriving first input signals for said first transistor and second input signals of opposite phase for said second transistor from said input means to said transistors, separate output means connected between the output electrodes of said first and second transistors for combining first amplified signals provided by said first transistor and second amplified signals provided by said second transistor to provide output signals for a push-pull stage, without biasing means utilizing depletion type Metal Oxide Semiconductor Field Effect Transistors, said separate output electrode of said first transistor connects directly to the input electrode of a third transistor and said separate output electrode of said second transistor connects directly to the input electrode of a fourth transistor, said third and fourth transistors each having separate output electrodes, directly combined reference electrode, derive from said separate output electrodes of said first and second transistors input signals of opposite phase, separate output means connected between the output electrodes of said third and fourth transistors for combining third amplified signals provided by third transistor and fourth amplified signals provided by said fourth transistor to provide output signals for a succeeding push-pull stage, utilizing enhanced type Metal Oxide Semiconductor Field Effect Transistors.

4. An amplifier comprising two identical stages in sequence, the first stage comrising first and second transistors, each transistor having a separate input electrode, a separate output electrode and a directly combined reference electrode, input means connecting the input electrodes of said first and second transistors for deriving first input signals for said first transistor and second input signals of opposite phase for said second transistor from said input means to said transistors, separate output means connected between the output electrodes of said first and second transistors for combining first amplified signals provided by said first transistor and second amplified signals provided by said second transistor to provide output signals for a push-pull stage, without biasing means utilizing depletion type Metal Oxide Semiconductor Field Effect Transistors, said separate output electrode of said first transistor connects directly to the input electrode of a third transistor and said separate output electrode of said second transistor connects directly to the input electrode of a fourth transistor, said third and fourth transistors each having separate output electrodes, directly combined reference electrode, derive from said separate output electrodes of said first and second transistors input signals of opposite phase, separate output means connected between the output electrodes of said third and fourth transistors for combining third amplified signals provided by third transistor and fourth amplified signals provided by said forth transistor to provide output signals for a succeeding push-pull stage, utilizing enhanced type Metal Oxide Semiconductor Field Effect Transistors, said separate output means from said third and fourth transistors comprises a coupling function to a succeeding stage, said succeeding stage comprising first and second transistors, each transistor having a separate input electrode, a separate output electrode and a directly combined reference electrode, input means connecting the input electrodes of said first and second transistors for deriving first input signals for said first transistor and second input signals of opposite phase for said second transistor from said input means to said transistors, separate output means connected between the output electrodes of said first and second transistors for combining first amplified signals provided by said first transistor and second amplified signals provided by said second transistor to provide output signals for a push-pull stage, without biasing means utilizing depletion type Metal Oxide Semiconductor Field Effect Transistors, said separate output electrode of said first transistor connects directly to the input electrode of a third transistor and said separate output electrode of said second transistor connects directly to the input electrode of a fourth transistor, said third and fourth transistors each having separate output electrodes, directly combined reference electrode, derive from said separate output electrodes of said first and second transistors input signals of opposite phase, separate output means connected between the output electrodes of said third and fourth transistors for combining third amplified signals provided by third transistor and fourth amplified signals provided by said fourth transistor to provide output signals for a succeeding push-pull stage, utilizing enhanced type Metal Oxide Semiconductor Field Effect Transistors.

5. An amplifier of claim 1, 2, 3, or 4 wherein said input means comprises a transformer coupling, said transformer coupling's secondary winding indirectly connect said separate input electrodes of said first and second transistors.

6. An amplifier of claim 5 wherein a capacitor means is connected between the input electrodes of said first and second transistor for utilizing in combination with said transformer coupling's secondary winding.

7. An amplifier of claim 1, 2, 3, or 4 wherein said input means comprises two separate capacitors, each connected to said separate input electrodes of said first and second transistors.

8. An amplifier of claim 1, 2, 3, or 4 wherein said input means comprises a microphone directly connected to said separate input electrodes of said first and second transistors.

9. An amplifier of claim 1 or 2 wherein said output means comprises a transformer coupling.

10. An amplifier of claim 1 wherein a resistance means indirectly connects said separate output means between the output electrodes of said first and second transistors.

11. An amplifier of claim 3 or 4 wherein said output means connected between the output electrodes of said third and fourth transistors comprises a transformer coupling.

12. An amplifier of claim 3 wherein said separate output means connected between the output electrodes of said third and fourth transistor comprises a load resistor.

13. An amplifier of claim 9 wherein a capacitor means is connected between the outputs of the secondary side of said transformer coupling.

14. An amplifier of claim 11 wherein a capacitor means is connected between the outputs of the secondary side of said transformer coupling.

* * * * *